(12) United States Patent
Shimakura et al.

(10) Patent No.: US 6,879,152 B2
(45) Date of Patent: Apr. 12, 2005

(54) EVALUATION SYSTEM AND METHOD OF MEASURING A QUANTITATIVE MAGNETIC FIELD OF A MAGNETIC MATERIAL

(75) Inventors: Tomokazu Shimakura, Kokubunji (JP); Hiroshi Suzuki, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 53 days.

(21) Appl. No.: 10/231,253

(22) Filed: Aug. 30, 2002

(65) Prior Publication Data

US 2003/0214285 A1 Nov. 20, 2003

(30) Foreign Application Priority Data

May 17, 2002 (JP) ........................................ 2002-142370

(51) Int. Cl.[7] .............................................. G01R 33/12
(52) U.S. Cl. ...................... 324/244; 324/235; 324/212; 250/306
(58) Field of Search ................................ 324/210, 212, 324/244, 244.1, 235, 260, 263; 73/105; 250/306, 307, 311

(56) References Cited

U.S. PATENT DOCUMENTS

RE36,488 E * 1/2000 Elings et al. ............... 250/234
6,437,562 B2 * 8/2002 Abe ............................ 324/210
6,448,766 B1 * 9/2002 Berger et al. ................ 324/244
6,504,365 B2 * 1/2003 Kitamura ..................... 324/244
6,605,941 B2 * 8/2003 Abe ............................ 324/244

FOREIGN PATENT DOCUMENTS

JP       2000-20929       1/2000

* cited by examiner

Primary Examiner—Jay Patidar
(74) Attorney, Agent, or Firm—Mattingly, Stanger, Malur & Brundidge, P.C.

(57) ABSTRACT

The magnetic field intensity distribution of a magnetic material sample, such as a magnetoresistive device, is measured with a probe having a tip portion of a magnetic material to which current is made to flow from a power source to the magnetic material. The probe is scanned relative to the surface of the magnetic material sample in two modes. In a first mode, the probe is scanned by being oscillated in a vertical direction to tap a surface of the sample to be tested. In a second mode, the probe is scanned while being held in contact with the measured surface. Corresponding first and second output signals from the two modes of scanning are processed to calculate the magnetic field intensity distribution of the sample magnetic material.

17 Claims, 6 Drawing Sheets

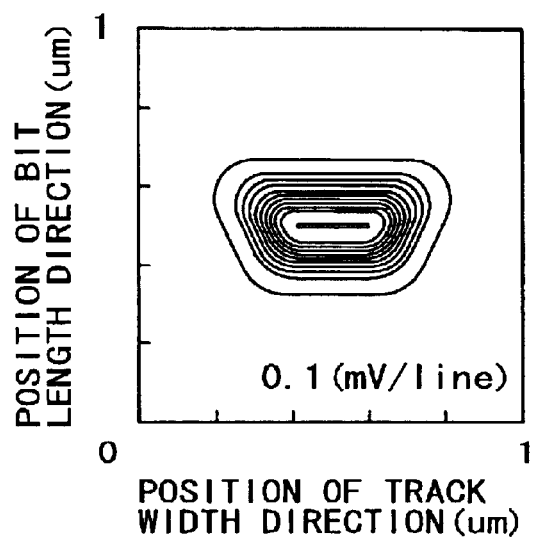
F I G. 6
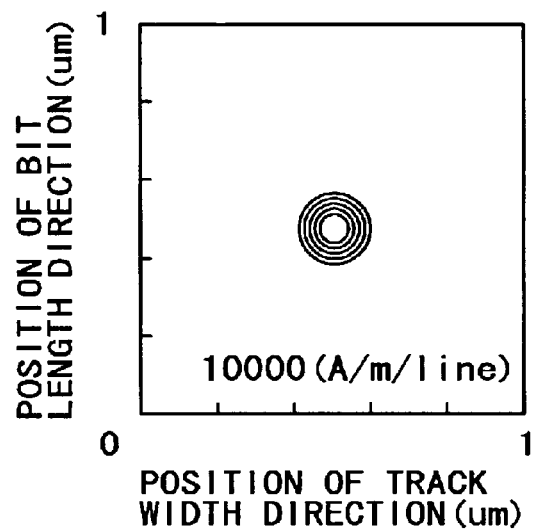
F I G. 7
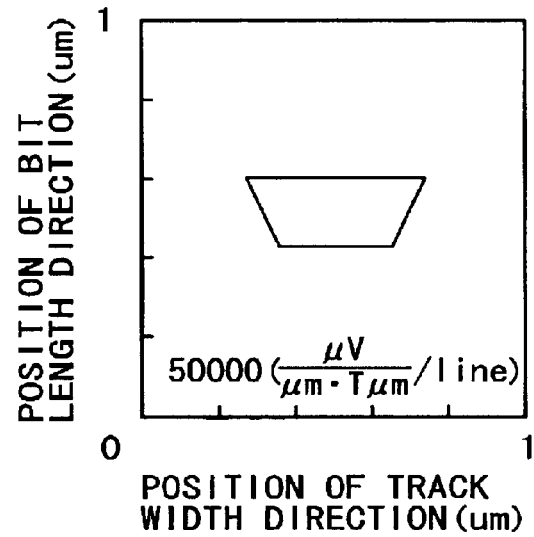
F I G. 8

EVALUATION SYSTEM AND METHOD OF MEASURING A QUANTITATIVE MAGNETIC FIELD OF A MAGNETIC MATERIAL

BACKGROUND OF THE INVENTION

1. Field of the Invention

The present invention relates to a system and method of evaluating a magnetic property of a magnetic material. Particularly, the invention relates to an evaluating system and method for evaluating a magnetic property of a magnetoresistive device as a magnetic material.

2. Description of the Related Art

In recent years, with the rapid increase in recording density of a magnetic disc apparatus, a width of a magnetic recording area recorded on a medium, that is, a track width has become narrower. Therefore, it is important to evaluate a track width and its sensitivity distribution (distribution of intensity of magnetic field) in a reproducing device with a magnetic head, such as a magnetoresistive device.

Conventionally, estimation of the track width and measurement of the sensitivity distribution in the magnetoresistive device is carried out by detecting an output signal of the magnetic head reproducing element by making a signal from a medium recorded in a narrow track off track of the magnetic head reproducing device. Further, there is also a method of evaluating a magnetic property of the magnetoresistive device such that a hysteresis property is investigated by applying a magnetic field to an entire magnetoresistive device.

JP-A No.20929/2000 discloses a means of measuring a sensitivity distribution of a magnetic head, in which a magnetic force microscope is utilized. According to the apparatus, a probe bearing magnetism is oscillated and scanned with the oscillation above a magnetic head and a distribution of a reproduced sensitivity is measured from a change in an electric signal of a magnetoresistive device. Since an oscillating current produced by an oscillating magnetic field of a probe is detected, noise can be removed comparatively easily. Further, since a probe having a sharpened tip is used, there is also achieved an advantage that a spatial resolution is high. Further, since it is not necessary to move the magnetic head mechanically, the apparatus has a characteristic that an influence of a mechanical error of the system is inconsiderable compared to a conventional method or apparatus using an actual recording medium to estimate the property, which incurs mechanical error.

However, according to the method described in JP-A No.20929/2000, the probe is oscillated at a position spaced apart from a magnetic head sliding face by a constant distance and therefore, information of the sensitivity distribution is a relative value, and therefore the information is not an absolute value. Further, the method does not include correcting the relative value to the absolute value in JP-A NO.20929/2000 and therefore, there poses a problem that the quantative evaluation of the sensitivity distribution of the reproducing head cannot be realized, although the sensitivity can be evaluated qualitatively.

Further, since a magnetization state of the probe changes at respective measurement due to a disturbance by an external magnetic field and the magnetization state differ depending on the respective probe, a measured shape of the reproduced sensitivity distribution changes on each occasion, the measurement cannot have a sufficient reproducibility.

SUMMARY OF THE INVENTION

In view of the conventional actual situation, the invention has an object of providing a property evaluation system and method capable of measuring a quantitative magnetic field intensity of a magnetic material at an arbitrary position from a measured surface of a magnetic material. Further, the present invention has been proposed with an object of providing a property evaluating system and a method of measuring that are capable of measuring a quantitative reproduced magnetic field intensity of a magnetic material and capable of investigating a magnetic property in a very small area of the magnetic material without depending on a magnetic field distribution of a probe.

In order to achieve the disclosed above object, according to the property evaluating system of a magnetic material of the invention, a current is applied to the magnetic material constituting an object to be measured. At the same time, a magnetic field is applied to the magnetic material and a change of the current with respect to the applied magnetic field is measured. Although the magnetic field is applied by scanning a stylus (probe) having a magnetic material at its tip portion above the measured surface of a sample to be measured, if there is other pertinent means of applying the magnetic field, the means may be used.

One of the characteristics of the property evaluating system and method of the magnetic material according to the invention resides in applying a magnetic field in two modes, first and second modes, when the magnetic field is applied to the sample, and obtaining an absolute value of the magnetic field distribution of the object to be measured from the provided change of the current.

According to the first mode, an oscillating magnetic field is applied in a condition of oscillating the probe while keeping an adequate spacing distance from the measured surface so that an oscillating tip portion of the probe is brought into contact with the measured surface. That is, the oscillating magnetic field is applied by oscillating the probe in the circumstance that the tip portion of the probe is brought into tapping contact with the measured surface.

In the second mode, the magnetic field is applied to the sample to be measured by scanning the probe while the tip portion of the probe is kept in contact with the measured surface. Then a change in the waveform of the applied current is made to flow to the sample and is measured with respect to the magnetic fields applied in the first mode and the second mode (defined as first current waveform and second current waveform for convenience), and by subtracting the first current waveform from the second current waveform, an absolute value of the magnetic field distribution of the measured sample is obtained (a detailed explanation will be given of the measurement principle in embodiments).

According to the property evaluating system and the property evaluating method of the magnetic material of the invention disclosed above, by adjusting an intensity of oscillation amplitude of the probe pertinently, the magnetic field intensity of the magnetic material at an arbitrary distance from the measured surface of the magnetic material is able to be quantitatively obtained.

BRIEF DESCRIPTION OF THE DRAWINGS

FIG. 6 is a characteristic diagram showing the distribution of magnetic field intensity of a magnetoresistive device at a spaced distance of 10 nm of an amplitude;

FIG. 7 is a characteristic diagram showing a distribution of an intensity of the magnetic field of a probe;

FIG. 8 is a diagram showing a distribution of a magnetic field intensity of a magnetoresistive device with the influence of the intensity of the magnetic field of the probe removed;

DETAILED DESCRIPTION OF THE PREFERRED EMBODIMENTS (Embodiment 1)

A detailed explanation will be given of a magnetic property evaluating system and method of a magnetic material according to the invention (hereinafter, simply referred as the system). Further, according to a preferred embodiment, a magnetoresistive device is used as the magnetic material sample that is evaluated.

Figure 1:
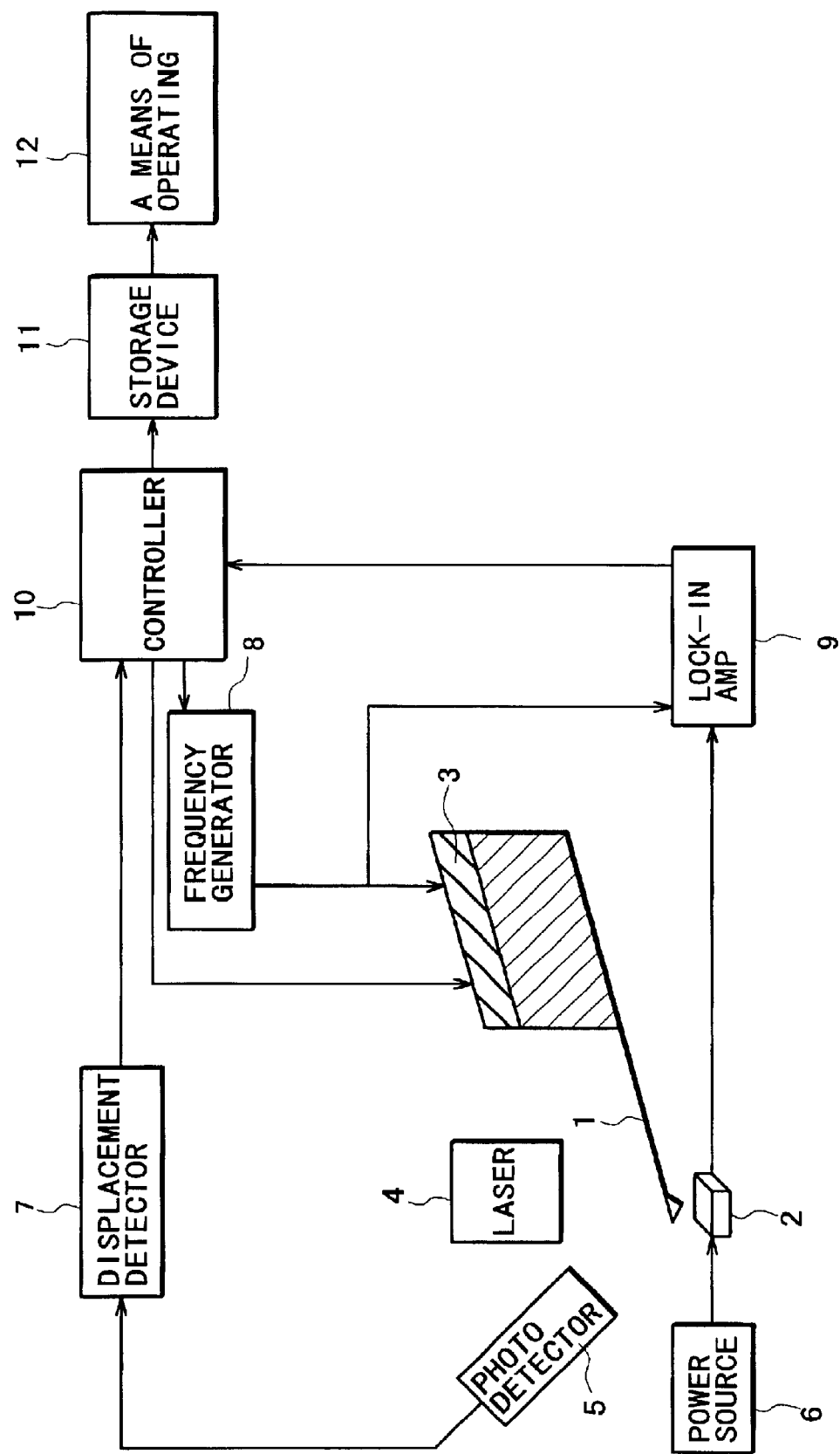
FIG. 1 is a diagram of a magnetic property evaluating system of a magnetoresistive device according to the invention.

FIG. 1 shows an example of the system according to the invention. Numeral 1 designates a probe a tip of which is provided with a magnetic material. Numeral 2 designates a magnetic material sample for magnetic property evaluation, which is mounted on a base not illustrated. Numeral 3 designates a piezoelectric element for applying a desired oscillation to the probe. Although not illustrated, the piezoelectric element is supported by a suitable support such as an arm or the like, that is capable of scanning a measured surface of the sample. Further, by the above-mentioned support, a distance between the probe and the device is maintained at a predetermined distance.

By scanning the probe 1 with respect to the measured surface of the magnetoresistive device 2, an external magnetic field is applied from the probe to the magnetic material sample. By oscillating the probe, an alternating current magnetic field can be applied to the sample. Numeral 4 designates a laser beam source, numeral 5 designates a photo detector, numeral 7 designates a displacement detector for calculating a displacement of the probe from an output signal of the photo detector and numeral 10 designates a controller for controlling the driving of the piezoelectric element. By controlling the oscillating amplitude of the probe, fine adjustment of the distance between the sample and the tip of the probe is carried out. Therefore, the distance between the tip of the probe and the sample is controlled with the beam source, the photo detector, the displacement detector, and the controller.

In particular, a laser beam emitted from the laser beam source 4 is reflected by the tip of the probe 1 and is made to be incident on the photo detector 5. An amount of the displacement on the probe 1 is measured by the displacement detector 7. The measured displacement amount is fed back to the controller 10. The controller 10 controls a voltage for driving the piezoelectric element 3 such that the probe 1 is oscillated with substantially constant amplitude, based on the obtained displacement amount. Although the oscillation of the probe is optically detected for controlling the oscillation amplitude of the probe, according to the embodiment, the oscillation amplitude of the probe may be controlled in another manner, such as by detecting a tunnel current flowing between the probe and the sample.

Sensing current is made to flow to the magnetic material sample 2 by using a power source 6. The tip of the probe is provided with a magnetic material, and the magnetic material sample 2 is the magnetoresistive device. Therefore, resistance of the magnetic material sample 2 is changed with respect to the change of the magnetic field applied from the tip of the probe 1. A scanning signal from the magnetic material sample is input to a lock-in amp 9. Although the change in the resistance of the magnetoresistive device is read in a form of a change in the voltage by using the lock-in amp 9, according to the embodiment, other measuring devices such as tester can be used for the measurement.

The lock-in amp receives the voltage for driving the piezoelectric element generated by a frequency generator 8 as a reference signal. That is, by synchronizing the scanning signal from the magnetoresistive device 2 with a frequency provided from the frequency generator 8 by the lock-in amp 9, only a component equal to the oscillation amplitude of the probe is extracted from the scanning signal. Therefore, the output of the lock-in amp 9 becomes an integrated value of a difference of the outputs of the magnetoresistive device 2, which is in a condition that the tip of the probe 1 is mostly spaced apart from the measured surface of the magnetoresistive device 2 and in a condition that the tip of the probe 1 is mostly proximate to the measured surface (scanning face) of the sample 2.

Figure 2:
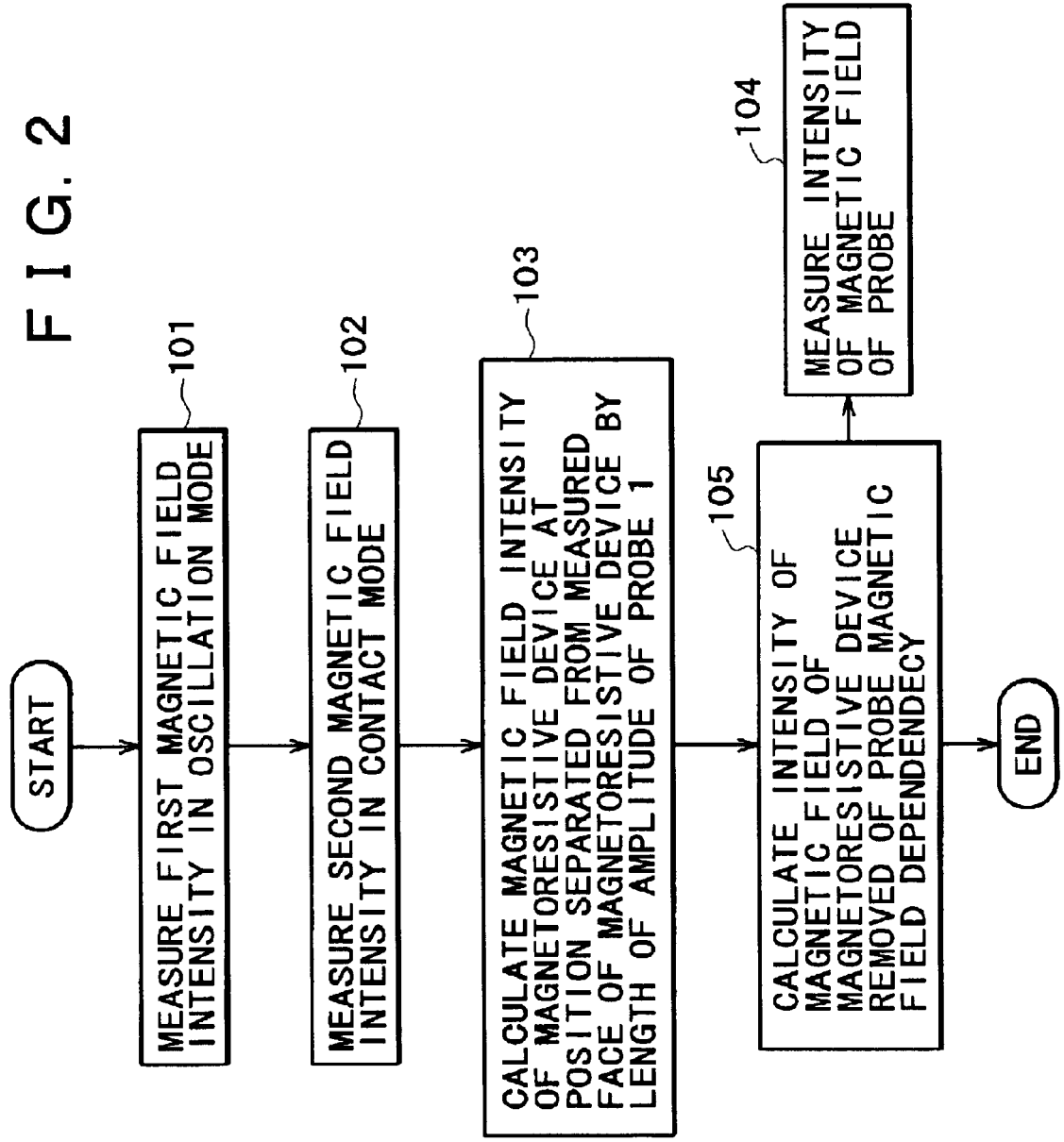
FIG. 2 is a flowchart showing a magnetic property evaluating method for a magnetoresistive device according to the invention.

FIG. 2 shows a flowchart of a sensitivity measuring procedure of the magnetic material. First, there is carried out step 101 in which the probe 1 is scanned while being oscillated vertically in the normal direction with respect to the measured surface of the magnetoresistive device 2, and then the first intensity of magnetic field of the magnetoresistive device 2 is calculated from a first scanning signal detected from the probe 1 and the first current signal detected from the magnetoresistive device 2.

According to step 101, the probe 1 is oscillated at a constant frequency provided from the frequency generator 8, and the measured surface of the magnetoresistive element is scanned by tapping the probe against the surface using the piezoelectric element 3. In the following, the scanning method is referred to as an oscillation mode. Further, in the oscillation mode, alternating current is made to flow as the sensing current and its waveform is observed using the lock-in amp.

Figure 3:
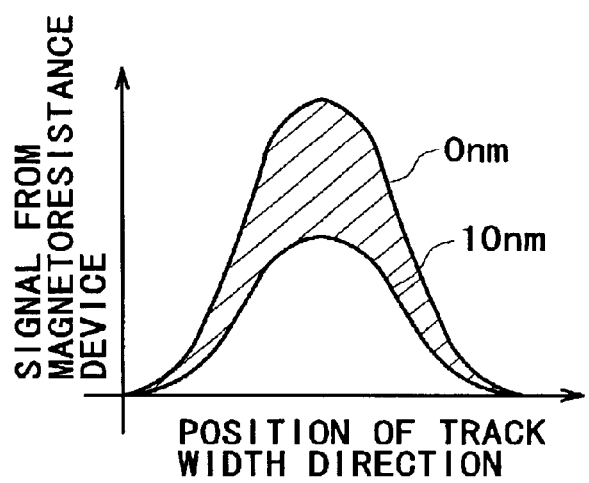
FIG. 3 shows an intensity distribution diagram of a magnetoresistive device in an oscillation mode.

FIG. 3 shows a schematic diagram of a signal of the lock-in amp provided in the oscillation mode. FIG. 3 is a sectional view of a magnetic field intensity distribution of the magnetoresistive device 2. In FIG. 3, an explanation will be given for the condition that the oscillation amplitude of the probe is 10 nm. Because the oscillation amplitude is 10 nm in the oscillation mode, a maximum value of a clearance between the tip of the oscillating probe 1 and the measured surface of the magnetoresistive device 2 is 10 nm.

Two curves shown in FIG. 3 signify a current signal obtained from a scanning signal of the magnetoresistive device 2 by the lock-in amp 9, which is in a condition that the clearance between the tip of the probe 1 and the measured surface of the magnetoresistive device 2 (hereinafter, simply referred to as the clearance) is separated by 10 nm and by 0 nm, respectively (tapping contact). Actually, the scanning current from the magnetic material sample 2 is oscillated at a hatched portion of FIG. 3 in accordance with the oscillation of the probe 1, the oscillation is indicated by an envelope for simplicity. That is, the hatched portion of FIG. 3 corresponds to an amount of output of the lock-in amp 9 in the oscillation mode. From the output of the lock-in amp 9 in the oscillation mode, an intensity of a reproduced magnetic field calculated from the difference between the output of the magnetoresistive device 2 at the clearance of 10 nm and the output of the magnetoresistive device at the clearance of 0 nm (hereinafter, referred to as first intensity of the magnetic field). A distribution of the obtained first intensity of the magnetic field is stored to a storage device 11.

Next, there is carried out step 102 in which the probe 1 is scanned while keeping the tip of the probe 1 in contact with the measured surface of the magnetoresistive device 2, and then a second intensity of the magnetic field of the magnetoresistive device 2 is calculated from a second scanning signal detected from the probe 1 and the second current signal provided from the magnetoresistive device 2.

According to the step 102 of calculating, the probe 1 is scanned in a condition of contacting with the measured surface of the magnetoresistive element 2 by using the piezoelectric element 3. That is, the probe 1 is scanned without vertical oscillation. The scanning method is referred to as a contact mode in the following description.

A signal from the magnetoresistive device 2 is input to the lock-in amp 9. In the case of the contact mode, by using the lock-in amp 9 as a low pass filter, only a direct current component of the current signal from the magnetoresistive device 2 is sampled. Further, in the case of the oscillation mode, the lock-in amp 9 is used as a band pass filter.

Figure 4:
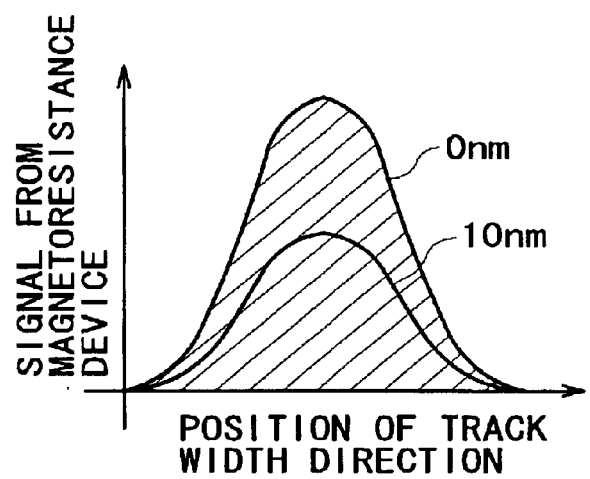
FIG. 4 shows an intensity distribution diagram of a magnetoresistive device in a contact mode.

The current signal from the magnetoresistive device 2 in the contact mode corresponds to a hatched portion of the characteristic diagram shown in FIG. 4. In FIG. 4, although the envelope at the clearance of 10 nm in the oscillation mode is also indicated for comparison, a signal corresponding to a curve in FIG. 4 with an indication of '0 nm' is actually detected. From an output of the lock-in amp 9 and the scanning signal of the probe 1 in the contact mode, there is provided an intensity of a reproduced magnetic field of the output of the magnetoresistive device 2 at the interval of 0 nm (hereinafter, referred to as second intensity of magnetic field). A distribution of the provided second intensity of the magnetic field is stored to the storage device 11.

Now, a value that is intended to be measured here is a spatial distribution of the intensity of the magnetic field at a distance from the magnetic material sample of 10 nm. Physically, the value corresponds to a distribution of an integral of the magnetic field from a point of infinite distance to a point of distance of 10 nm. In reference to FIG. 3, the value corresponds to a blank portion on a lower side of the envelope indicated as '10 nm'. In order to calculate the value corresponding to the portion directly, the probe might be oscillated with an infinite amplitude at a position of the distance from the measured surface of the magnetic material sample of 10 nm. However, this is not possible, actually. Therefore, a different concept is employed, as shown in FIG. 4, wherein the scanning current in the contact mode is measured, and then the scanning current of FIG. 3 measured in the oscillation mode is subtracted and the scanning current corresponding to the blank portion of FIG. 3 is calculated. That is, the principle of the invention is in the conception that a standard point of the measurement is converted from the point of infinite distance to the point of the 0 distance and the standard point is returned to the original point in a procedure of analyzing data.

Figure 5:
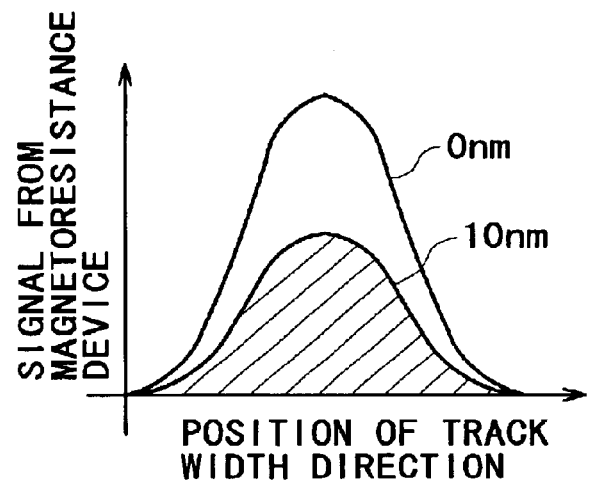
FIG. 5 shows an intensity distribution diagram of a magnetic field intensity of a magnetoresistive device.

A detailed description will be given of the analyzing procedure in reference to FIG. 2 and FIG. 5. At step 103 of FIG. 2, with the processing of the first intensity of the magnetic field and the second intensity of the magnetic field, a calculation for determining a distribution $B_{10}(x, y)$ that is the intensity of the magnetic field of the magnetoresistive device sample 2 at a point spaced apart from the measured surface of the magnetoresistive device 2 by 10 nm of the amplitude of the probe 1 is obtained. At step 103, $B_{10}(x, y)$ is calculated based on an operation in accordance with the following Equation 1, which is carried out by a processor 12 such as a signal processor, microcomputer, etc. In Equation 1, $A_{10}(x, y)$ denotes a distribution of the intensity of the reproduced magnetic field provided in the oscillation mode at the amplitude of 10 nm of the probe 1, in other words, the distribution of the first intensity of the magnetic field shown in FIG. 3, while $B_0(x, y)$ denotes the distribution of the intensity of the reproduced magnetic field provided in the contact mode, that is, the distribution of the second intensity of the magnetic field shown in FIG. 4. Further in Equation 1, x and y denote coordinates of the measured surface.

$$B_{10}(x, y) = B_0(x, y) - A_{10}(x, y) \quad \text{Equation 1}$$

The distribution $B_{10}(x, y)$ of the intensity of the magnetic field of the magnetoresistive device 2 is determined as described above. Here, an example of $B_{10}(x, y)$ is shown in FIG. 5. Further, the determined distribution $B_{10}(x, y)$ of the intensity of the reproduced magnetic field is stored to the storage device 11.

According to the disclosed above steps 101 through 103, the intensity of the magnetic field of the magnetoresistive device 2 at a position spaced apart from the measured surface of the magnetoresistive device 2 by 10 nm of the amplitude of the probe 1, that is, at an arbitrary clearance between the probe 1 and the magnetoresistive device 2. Here, as an example, the distribution of the intensity of the magnetic field of the magnetoresistive device 2 at the position of 10 nm from the measured surface is shown in FIG. 6.

Further, according to the property evaluating method of the magnetoresistive device 2 to which the invention is applied, there are provided step 104 of measuring an intensity of a magnetic field of the probe 1 and step 105 of calculating the intensity of the magnetic field of the magnetoresistive device 2 removed of the intensity of the magnetic field of the probe 1 by carrying out Laplace transformation and inverse Laplace transformation as operations for removing the intensity of the magnetic field of the probe 1 from the intensity of the magnetic field of the magnetoresistive device 2 at the position separated therefrom by the length of the amplitude of the probe 1.

At step 104, a distribution of an intensity of a magnetic field leaked from the probe 1 is quantitatively measured. For example, a magnetic field leaked to the space can be measured with high spatial resolution by an electron beam tomography method. Thereby, the magnetic field applied to the magnetoresistive device 2 by the probe 1 is quantitatively determined. The determined intensity of the leakage magnetic field of the probe 1 is stored to the storage device 11. Further, as an example, the distribution of the intensity of the magnetic field applied to the magnetoresistive device 2, that is, the intensity of the magnetic field of the probe 1, is depicted in FIG. 7.

At step 105, in order to determine the intensity of the magnetic field of the magnetoresistive device 2 with the intensity of the leakage magnetic field of the probe 1 removed, the following operation is carried out by using the processor 12. The distribution of the intensity of the magnetic field of the magnetoresistive device 2 at the position of 10 nm from the measured surface (magnetic field distribution shown in FIG. 6) is a result of reacting with the intensity of the magnetic field of the probe 1 (magnetic field distribution shown in FIG. 7). Hence, the distribution of the intensity of the reproduced magnetic field of the magnetoresistive device 2 per se which is not dependent on the magnetic field applied by the probe 1 is performed by the following operation.

Here, the intensity of the magnetic field of the magnetoresistive device 2 at the position of 10 nm from the measured surface as shown in FIG. 6, that is, the distribution of the intensity of the magnetic field actually measured at step 103, is designated by notation r(x, y). Further, the distribution of the intensity of the magnetic field of the probe 1 as shown by FIG. 7, that is, the distribution of the intensity of the magnetic field measured at step 104, is designated by notation p(x, y). Furthermore, the distribution of the intensity of the reproduced magnetic field of the magnetoresistive device 2 that an influence of the intensity of the leakage magnetic field of the probe 1 is removed, is designated by notation q(x, y). In the circumstance, the following relationship is established thereamong.

$$r(x, y) = \int\int p(s-x, t-y)q(s, t)ds dt \qquad \text{Equation 2}$$

In the case of the embodiment, p(x, y) is measured at step 104, r(x, y) is measured at step 103 and therefore, by a calculation with the use of Equation 2 disclosed above, q(x, y) is calculated.

Here, if we let quantities of Laplace transformed p(x, y), q(x, y), and r(x, y) to denote as p', q', and r' respectively, then a relationship of Equation 3 disclosed below follows. Further, by solving the relationship shown below in Equation 3 with respect to q' and applying an inverse Laplace transformation, q(x, y) is gained.

$$r' = p'q' \qquad \text{Equation 3}$$

For example, suppose that the magnetic field as much as the intensity of the leakage magnetic field of the probe 1 is applied to the magnetoresistive device 2, and the intensity of the magnetic field of the magnetoresistive device 2 at the position of 10 nm from the measured surface is measured, the distribution of the intensity of the reproduced magnetic field of the magnetoresistive device 2 without the influence of the magnetic field distribution probe 1 would be obtained from the calculation based on Equation 2 and Equation 3, as shown by FIG. 8.

Obtaining the intensity of the reproduced magnetic field of the magnetoresistive device 2 at an arbitrary position spaced apart from the measured surface of the magnetoresistive device 2 by the intensity of amplitude of the probe, is the same as measuring the intensity of the reproduced magnetic field of the magnetoresistive device 2 when the intensity of the magnetic field of the probe 1 applied to the magnetoresistive device 2 is changed.

Figure 9:
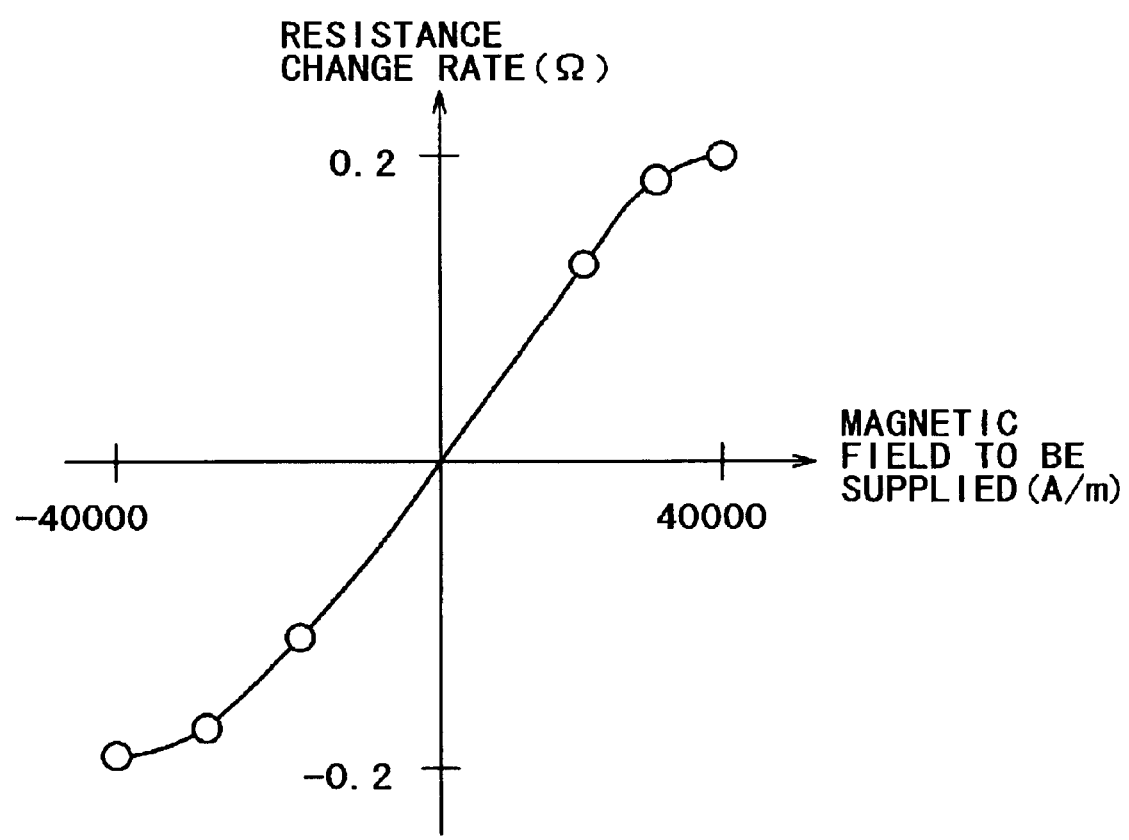
FIG. 9 is a diagram showing a relationship between the magnetic field intensity and the magnet field to be applied.

Therefore, once a relationship between the intensity of the magnetic field of the magnetoresistive device 2 and the magnetic field applied by the probe 1 at a position to be investigated, a localized resistance-magnetic field curve can be achieved as shown in FIG. 9. Here, in order to obtain a resistance-magnetic field curve in a negative applied field region, the probe 1 may be magnetized in an inverse direction in the measurement, or the probe 1 previously magnetized in the inverse direction may be used. Thereby, the magnetic properties of the magnetoresistive device 2 such as the resistance change rate, hysteresis, nonsymmetry and the like can be determined.

Also, various properties of the magnetoresistive device 2 such as a read track width with sufficient accuracy, a resolution that influences on the frequency characteristic and a half width (PW50) of a peak of reproduced waveform can be derived from the quantitized intensity of the reproduced magnetic field of the magnetoresistive device 2.

(Embodiment 2)

Figure 10:
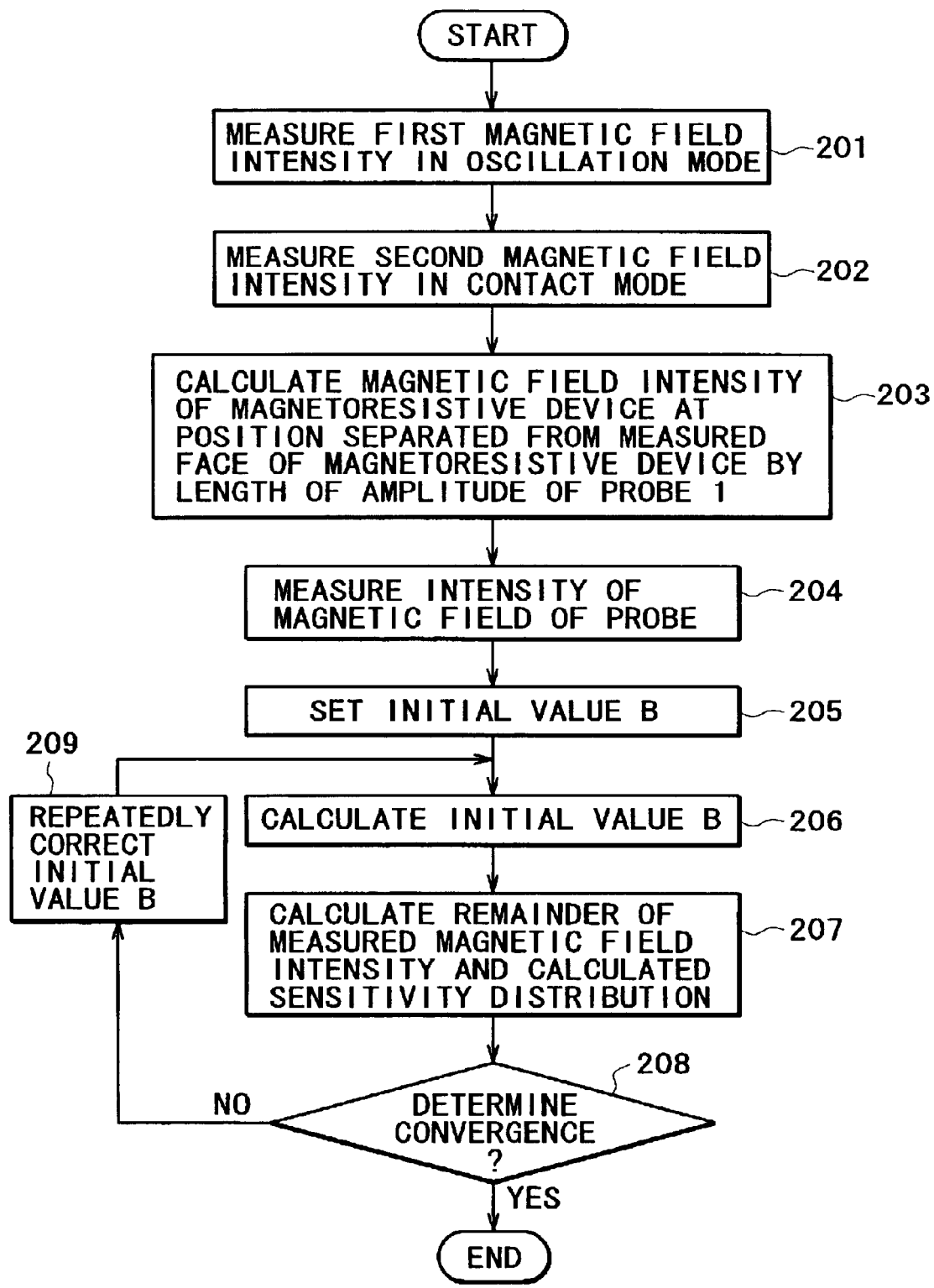
FIG. 10 is a flowchart showing an embodiment applied with the invention.

According to step 105 of the flowchart shown in FIG. 2, while the intensity of the reproduced magnetic field of the magnetoresistive device 2 without the influence of the leakage magnetic field of the probe 1 as shown in FIG. 8 is determined with the use of Equations 2 and 3. On the other hand, the intensity of the reproduced magnetic field of the magnetoresistive device 2 without the influence of the leakage magnetic field of the probe 1 can be measured with the use of another algorythm in accordance with a flowchart shown in FIG. 10.

The following is an explanation of an embodiment that the intensity of the reproduced magnetic field of the magnetoresistive device 2 without the influence of the magnetic field of the probe 1 is determined with the use of another algorythm.

First, there is carried out step 201 of calculating the first intensity of the magnetic field of the magnetoresistive device 2, in a same manner as in step 101 disclosed above.

Next, there is carried out step 202 of calculating the second intensity of the magnetic field of the magnetoresistive device 2, in a same manner as in step 102 disclosed above.

Next, there is carried out step 203 of calculating the intensity of the magnetic field of the magnetoresistive device 2 at a position spaced apart from the measured surface of the magnetoresistive device 2 by the 10 nm of the amplitude of the probe 1, in a same manner as in step 103 disclosed above Then, there is carried out step 204 of measuring the intensity of leakage magnetic field of the probe 1 in a same manner as in step 104 disclosed above.

Next, there is carried out step 205 of calculating an initial value (hereinafter, referred to as estimated value B) of the intensity of the reproduced magnetic field of the magnetoresistive device 2 with the influence of the applied magnetic field from the probe 1 removed, which is anticipated from the intensity of the magnetic field of the magnetoresistive device 2 at the position spaced apart from the measured surface by 10 nm of the amplitude of the probe 1 (intensity of magnetic field determined at step 203).

Then, there is carried out step 206 of calculating an estimated value (hereinafter, referred to as estimated value B') of the intensity of the magnetic field of the magnetoresistive device 2 at the position apart from the measured surface by 10 nm of the amplitude of the probe 1 based on the estimated value B set at the step 205 from the Equation 1. Next, there is carried out step 207 of calculating a difference of the estimated value B' set at step 206 and the intensity of the magnetic field measured at step 203. Next, there is carried out step 208 of comparing the difference calculated at step 207 and a predetermined threshold value (for instance, set by the user) and determining whether the difference exceeds the set value.

Here, if the difference is less than the threshold value, then the calculation is ended and the estimated value B set at step 205 is set as the intensity of the magnetic field of the magnetoresistive device 2 with the influence of the applied magnetic field from the probe 1 removed. If the difference is equal to or greater than the threshold value, there is carried out step 209 of correcting the estimated value B set at step 205. Further, based on the estimated value B corrected at step 209, there is carried out step 206 of calculating again the estimated value B' similar to the disclosed above. Further, the correction is carried out repeatedly until the difference becomes equal to or smaller than the set value. By repeating the above steps 206 through 209, there can be calculated accurately the intensity of the magnetic field of the magnetoresistive device 2 removed of the magnetic field to be applied by the probe 1.

As described above in details, according to the property evaluating system and the property evaluating method of the invention, by pertinently adjusting the length of amplitude of the probe, the intensity of the magnetic field of the magnetic material at an arbitrary position from the measured surface of the magnetic material can be calculated. Further, there can be provided the quantized intensity of the magnetic field of the magnetic material which is not dependent on the intensity of the magnetic field of the probe.

What we claim:

1. A magnetic property evaluating system of a sample of a magnetic material comprising:

a probe having a magnetic material at a tip portion; means for oscillating the probe at an oscillating frequency;

means for controlling a distance between the tip portion of the probe and a sample to be measured;

means for supplying a sensing current to the sample of the magnetic material;

means for receiving an output signal from the sample and extracting a component of the output signal synchronized with the oscillating frequency; and means for calculating that processes an output signal of the extracting means including calculating a distribution of a magnetic field of the sample to be measured by subtracting an output signal of the extracting means with the probe being scanned in a first state from an output signal of the extracting means with the probe being scanned in a second state, wherein the tip portion of the probe is in tapping contact with a measured surface of the sample to be measured by the means for oscillating the probe in the first state, and wherein the tip portion of the probe is kept in contact with the measured surface of the sample to be measured in the second state.

2. A magnetic property evaluating system of a sample of a magnetic material according to claim 1, further comprising:

a storage device for storing an intensity of a magnetic field of the probe;

wherein the processor calculates the distribution of the magnetic field of the sample by removing the magnetic field from the output signal of the extracting means measured in the first state.

3. A magnetic property evaluating system of a sample of a magnetic material according to claim 2, wherein Laplace transformation and inverse Laplace transformation are performed as operations of removing the intensity of the magnetic field of the probe.

4. A magnetic property evaluating system of a sample of a magnetic material according to claim 2, further comprising:

means for measuring the intensity of the magnetic field of the probe.

5. A magnetic property evaluating system of a sample of a magnetic material according to claim 4, wherein the means of measuring the intensity of the magnetic field of the probe is an apparatus using electron beam tomography.

6. A magnetic property evaluating system of a sample of a magnetic material according to claim 1, further comprising:

a means of controlling an oscillation amplitude of the probe as a means of controlling the distance between the tip portion of the probe and the sample to be measured.

7. A magnetic property evaluating system of a sample of a magnetic material according to claim 1, further comprising:

a light source for irradiating light to the probe; and a photo detector for detecting reflected light from the probe.

8. A magnetic property evaluating system of a sample of a magnetic material according to claim 1, wherein the sample of the magnetic material is a magnetoresistive device, and a change in a resistance of the magnetoresisitive device is read in a form of a change in the voltage.

9. A magnetic property evaluating system of a sample of a magnetic material, said system comprising:

a probe having a magnetic material at a tip portion;

a piezoelectric element for oscillating the probe;

a frequency generator for applying a voltage at a predetermined frequency to the piezoelectric element;

a lock-in amp using a frequency of a voltage generated by the frequency generator as a reference frequency and using the voltage from the sample as an input signal;

a power source for supplying a sensing current to the sample;

means for controlling a distance between the tip portion of the probe and the sample to be measured; and a processor that processes an output signal from the lock-in amp;

wherein the processor calculates a distribution of a magnetic field of the sample by subtracting a first output signal of the lock-in amp measured in a state of scanning the probe in a state in which the tip portion taps a measured surface of the sample by oscillating the probe with the piezoelectric element from a second output signal of the lock-in amp measured in a state of scanning the probe while maintaining the tip portion in contact with the measured surface of the sample.

10. A magnetic property evaluating system of a sample of a magnetic material according to claim 9, wherein the sample of the magnetic material is a magnetoresistive device, and a change in a resistance of the magnetoresisitive device is read in a form of a change in the voltage.

11. A magnetic property evaluating method of a sample of a magnetic material comprising the steps of:

applying sensing current to a sample of a magnetic material;

measuring a change in a voltage by applying the sensing current to the sample of the magnetic material in a first state in which a probe having a magnetic material at a tip portion thereof is scanned while maintaining the tip portion in contact with a measured surface of the sample of the magnetic material;

measuring a change in a voltage by applying the sensing current to the sample of the magnetic material in a second state in which the probe is scanned in a state in which the tip taps on the measured surface of the sample by oscillating the probe;

extracting a frequency component having an oscillating frequency equal to an oscillating frequency of the probe from a waveform of the voltage measured in the second state; and calculating a distribution of a magnetic field of the sample of the magnetic material by subtracting the extracted waveform of the voltage from a waveform of the voltage measured in the first state.

12. A magnetic property evaluating method of a sample of a magnetic material according to claim 11, wherein a distribution of the magnetic field of the sample of the magnetic material is measured by extracting the frequency component having the same oscillating frequency as the oscillating frequency of the probe from the waveform of the voltage measured in the first state and subtracting the frequency component extracted from the waveform of the voltage measured in the second state from the frequency component extracted from the waveform of the voltage measured in the first state.

13. A magnetic property evaluating method of a sample of a magnetic material according to claim 12, wherein an intensity of a magnetic field of the probe is removed from the waveform of the voltage measured in the second state.

14. A magnetic property evaluating method of a sample of a magnetic material according to claim 13, wherein Laplace transformation and inverse Laplace transformation are performed as operations of removing the intensity of the magnetic field of the probe from the waveform of the voltage measured in the second state.

15. A magnetic property evaluating method of a sample of a magnetic material according to claim 14, wherein the intensity of the magnetic field of the probe is measured by using an electron beam tomography technique.

16. A magnetic property evaluating method of a sample of a magnetic material according to claim 13, further comprising the steps of:

calculating an estimated value B of the distribution of the magnetic field of the sample of the magnetic material which had a distrubution of a magnetic field of the probe removed;

calculating an estimated value B' of the distribution of the magnetic field of the sample of the magnetic material at a position apart from the measured surface by the length of the amplitude of the probe based on the estimated value B;

calculating a difference of the distribution of the magnetic field of the sample of the magnetic material at a position apart from the measured surface by the length of the amplitude of the probe and the estimated value B'; and comparing the difference and a predetermined set value;

wherein when the difference is equal to or smaller than a predetermined set value, the estimated value B is set to the distribution of the magnetic field of the sample of the magnetic material which had a distribution of a magnetic field of the probe removed and when the difference exceeds the predetermined set value, correcting the estimated value B.

17. A magnetic property evaluating method of a sample of a magnetic material according to Claim 11, wherein the sample of the magnetic material is a magnetoresistive device, and a change in a resistance of the magnetoresisitive device is read in a form of the change in the voltage.

* * * * *